United States Patent [19]

Knecht et al.

[11] Patent Number: 5,313,371
[45] Date of Patent: May 17, 1994

[54] SHIELDING APPARATUS FOR NON-CONDUCTIVE ELECTRONIC CIRCUIT PACKAGES

[75] Inventors: Thomas A. Knecht, Crystal Lake; Brian M. Mancini, Carol Stream; Jean-Robert Achille, Bloomingdale; David J. Sieben, Palatine, all of Ill.

[73] Assignee: Motorola, Inc., Schaumburg, Ill.

[21] Appl. No.: 4,775

[22] Filed: Jan. 14, 1993

Related U.S. Application Data

[63] Continuation of Ser. No. 663,979, Mar. 4, 1991, abandoned.

[51] Int. Cl.$^5$ ............................................. H05K 9/00
[52] U.S. Cl. .................................. 361/818; 174/35 R; 174/35 MS; 29/25.35; 228/121; 228/215; 427/239; 455/154.1; 455/158.1; 455/183.1
[58] Field of Search ................. 29/25.35; 174/35 R, 174/35 MS; 228/121, 123, 124, 214, 215; 361/816, 818; 427/239, 250, 282, 287; 455/154, 158, 183

[56] References Cited

U.S. PATENT DOCUMENTS

| 2,293,839 | 8/1942 | Linder | 361/818 |
|---|---|---|---|
| 3,584,305 | 6/1971 | Leostic | 455/316 |
| 3,590,467 | 7/1971 | Chase | 228/121 |
| 3,766,560 | 10/1973 | Bornhorst et al. | 342/428 |
| 3,921,885 | 11/1975 | Knox | 228/121 |
| 4,077,558 | 3/1978 | Carlson et al. | 228/121 |
| 4,135,158 | 1/1979 | Parmet | 455/168 |
| 4,227,254 | 10/1980 | Bauer | 455/154 |
| 4,247,034 | 1/1981 | Burkart et al. | 228/121 |
| 4,266,295 | 5/1981 | Bach, Jr. | 455/158 |
| 4,268,915 | 5/1981 | Parmet | 455/158 |
| 4,293,986 | 10/1981 | Kobayashi et al. | 228/121 |
| 4,503,513 | 3/1985 | Pogue, Jr. | 364/935 |
| 4,567,317 | 1/1986 | Ehrlich et al. | 174/35 MS |
| 4,662,967 | 5/1987 | Bogan et al. | 174/35 R |
| 4,709,406 | 11/1987 | Omoto | 455/183 |
| 4,717,989 | 1/1988 | De Barros et al. | 361/818 |
| 4,717,990 | 1/1988 | Togcu | 361/818 |
| 4,739,453 | 4/1988 | Karokawa | 361/818 |
| 4,791,527 | 12/1988 | Brown | 361/424 |
| 4,848,643 | 7/1989 | Frische et al. | 228/121 |
| 4,861,941 | 8/1989 | Kubo et al. | 174/35 R |
| 4,895,291 | 1/1990 | Ozimek et al. | 228/121 |
| 4,981,139 | 1/1991 | Pfohl | 128/671 |
| 4,995,020 | 2/1991 | Mitchell | 368/185 |
| 5,030,875 | 7/1991 | Knecht | 310/346 |
| 5,030,935 | 7/1991 | Williams et al. | 361/752 |
| 5,044,869 | 9/1991 | Shimdo et al. | 228/215 |
| 5,172,077 | 12/1992 | Funada | 361/752 |

FOREIGN PATENT DOCUMENTS

| 0397929 | 11/1990 | European Pat. Off. | 228/214 |
|---|---|---|---|
| 2919528 | 11/1979 | Fed. Rep. of Germany | 228/215 |
| 1478498 | 6/1977 | United Kingdom | 228/215 |
| WO9216095 | 9/1992 | World Int. Prop. O. | 361/818 |

OTHER PUBLICATIONS

IBM Technical Disclosure Bulletin vol. 19 No. 1 Jun. 1976 by G. DiGiacomo.
IBM Technical Disclosure Bulletin "Cermet Solder Dam" by R. W. Angelo et al. vol. 21 No. 12 May 1979.

*Primary Examiner*—Leo P. Picard
*Assistant Examiner*—Donald A. Sparks
*Attorney, Agent, or Firm*—James A. Coffing; Joseph P. Krause

[57] ABSTRACT

A shielding apparatus for use with a non-conductive package has an insulated lid (102) which is retained in contact with a substrate (104) for holding an electrical circuit. The shielding apparatus includes a first conductive flash (201) deposited on the interior surface of the insulated lid (102), to produce a substantially contiguous conduction layer, and a second conductive flash (203) deposited over a film (110) disposed on the edge of the insulated lid (102), to produce a partially contiguous conduction layer. The shielding apparatus also includes a layer (108) for affixing the insulated lid (102) to the substrate (104), to produce an enclosure for isolating the electrical circuit from extraneous radio frequency (RF) energy.

11 Claims, 3 Drawing Sheets

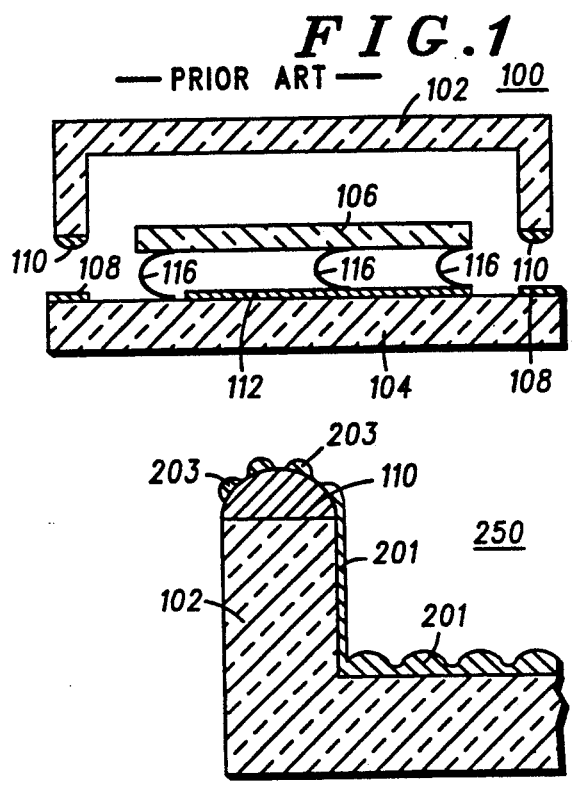
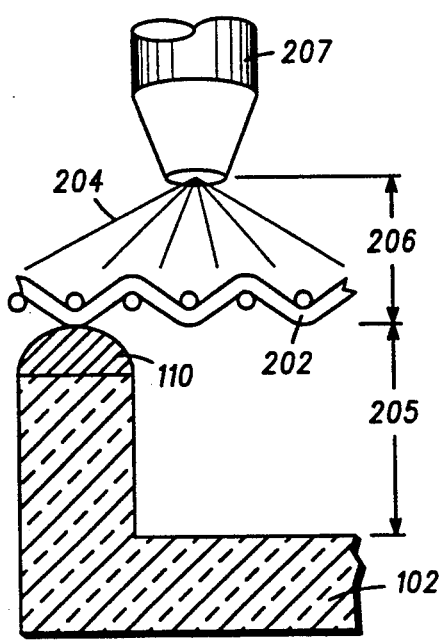
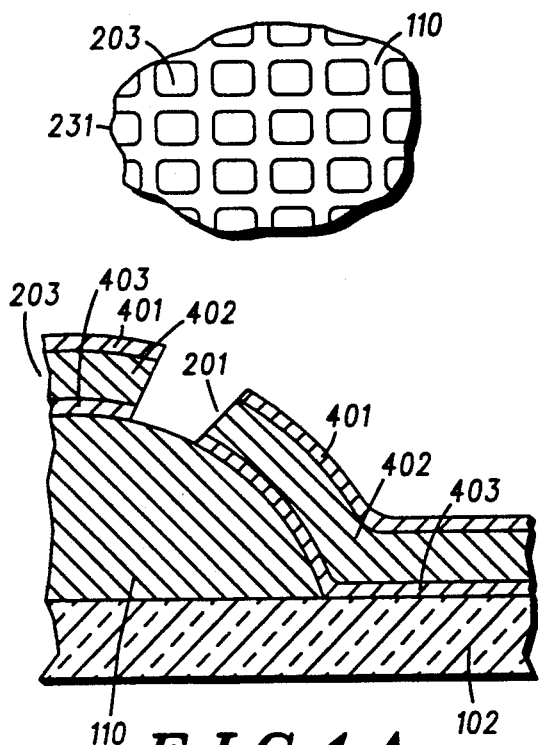
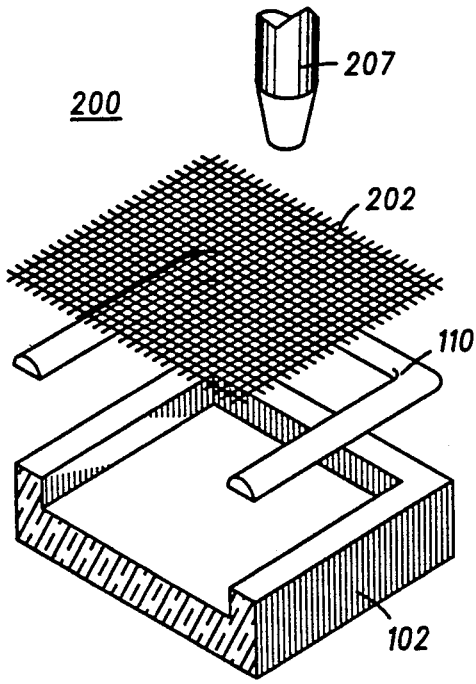

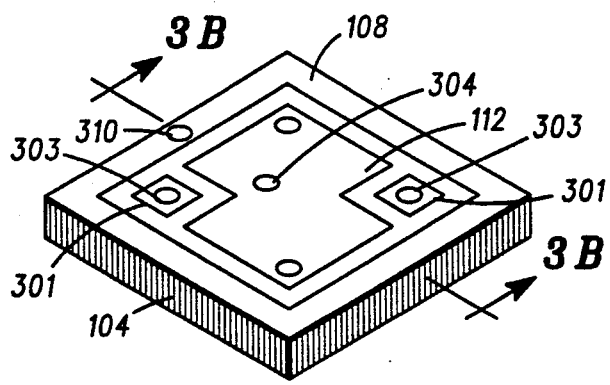
FIG.3A
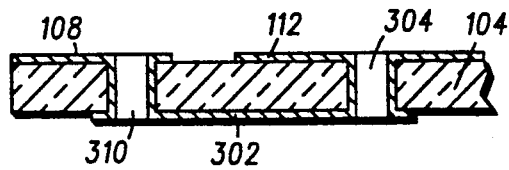
FIG.3B
FIG.5
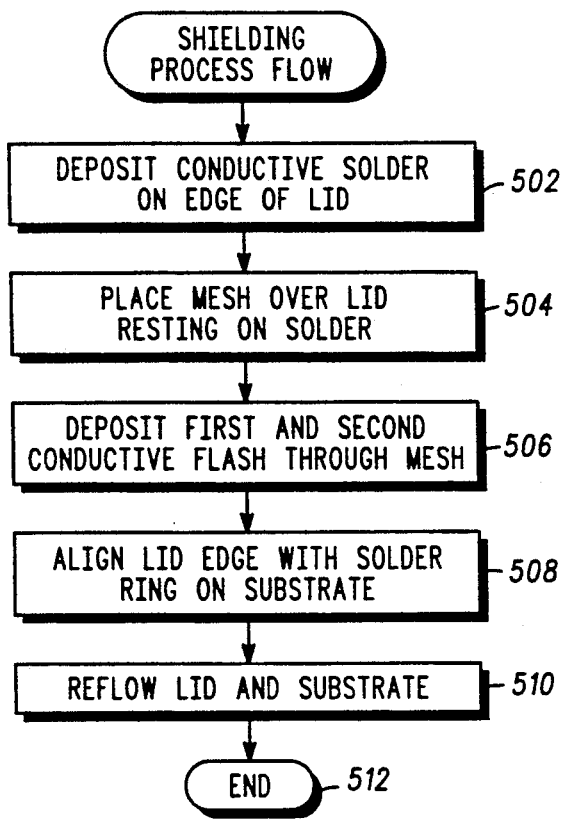
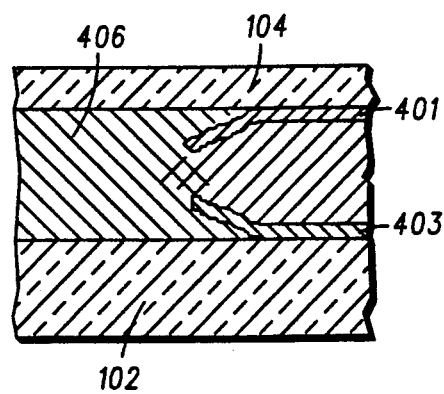
FIG.4B

SHIELDING APPARATUS FOR NON-CONDUCTIVE ELECTRONIC CIRCUIT PACKAGES

This is a continuation of application Ser. No. 07/663,979, filed Mar. 4, 1991 and now abandoned.

FIELD OF THE INVENTION

The present invention relates generally to shielding of electronic circuitry, and more particularly to a shielding apparatus for use with non-conductive electronic circuit packages.

BACKGROUND OF THE INVENTION

The requirement for isolation of radio frequency (RF) energy from electronic circuitry has existed since the beginning of the electronic age. For every circuit that generates, and is sensitive to, this form of energy, there is a desire to electrically isolate this circuit from the external environment in which it operates. In general, it is highly desirable to minimize the effect that a given circuit has on its environment as well as the effect that the environment has on the circuit. In particular, when designing a shield for a frequency control device, such as an oscillator circuit, it is critical to isolate the circuit from other RF sources which may be emitting signals whose primary or harmonic frequencies are found near the frequency of oscillation.

The aforementioned requirement is especially true for components used in communication system's where even small levels of RF radiation may cause degradation in critical electrical parameters of the target circuit. This problem is accentuated when shielding must be provided while maintaining a hermetically sealed, or airtight, joint between the cover and the substrate holding the electronic circuit, such as in a quartz crystal resonator, or filter. Hermeticity is required in order to prevent air contaminants from coming in contact with the oscillating quartz plate, as even microscopic particulates have a dramatic impact on the frequency characteristics of the device. This requirement presents the added challenge of designing a highly manufacturable process (one with minimal material utilization) to provide an electrical path between the ground plane of the electrical circuit and the shielding enclosure. Though it represents a serious challenge to the electronic Package designer, such a ground path is a necessary feature if the component is expected to comply with the ever-increasing parametric specifications regarding attenuation of extraneous RF energy. An example of this is the noise-floor, or ultimate-attenuation, specification for a quartz crystal filter, which greatly depends on the effectiveness of the RF shielding provided. In particular, there are some applications which require a 65–70 dB noise floor, a level which is virtually unattainable without adequate shielding.

U.S. Pat. No. 4,739,453, "Shielding Apparatus for a Printed Circuit Board" suggests the use of plated through-holes, or vias, separated by a predetermined distance, to serve as an RF shield. These through-holes, whose spacing determines the wavelength of signals that are shielded, are used to provide an electrical path between the respective ground planes on several layers of a multiple layer printed circuit board. This technique addresses only systems using metallic cases for shielding, and does not address any systems having hermeticity requirements, such as the aforementioned frequency control devices.

Shielding for components such as quartz resonators and filters is typically provided by a conductive metal enclosure, or lid. The lid is then affixed to the substrate holding the circuit using processes which are well known in the art. Unfortunately, such metal lids are often cost prohibitive in the manufacturing of such components, where the cost of a stamped metal lid often exceeds 20% of the total product cost. In todays market, where competitive pricing is not a luxury, but a necessity for market survival, product cost reductions are often the manufacturers highest priority. Focusing on the cost problem, many manufacturers have begun using a molded lid, often constructed of a non-conductive material, such as ceramic. Such materials also perform better than metal through the reflow process, where undesired wicking of solder-based metallization cannot otherwise be adequately controlled. Unfortunately, the very nature of the non-conductive material further compounds the problem of providing adequate shielding, as electrical conduction, and subsequent dispersal of undesired RF energy, is the foundation of any good shielding system.

Accordingly, there exists a dire need for a cost effective, easily manufacturable, means for shielding an electronic circuit in a non-conductive enclosure from extraneous RF energy, while complying with any hermeticity requirements, such as those found in frequency control devices.

SUMMARY OF THE INVENTION

The present invention encompasses a shielding apparatus for a non-conductive package having an insulated lid. The insulated lid is retained in contact with a substrate which holds an electrical circuit. The shielding apparatus includes a first conductive flash deposited on the interior surface of the insulated lid, to produce a substantially contiguous conduction layer, and a second conductive flash deposited over a film disposed on the edge of the insulated lid, to produce a partially contiguous conduction layer. The shielding apparatus also includes a means for affixing the insulated lid to the substrate, to produce an enclosure for isolating the electrical circuit from extraneous radio frequency (RF) energy.

BRIEF DESCRIPTION OF THE DRAWINGS

FIG. 1 is a cross sectional view of a surface-mount quartz crystal filter which is known in the art.

FIG. 2A is an isometric view showing the arrangement of components used in the shielding process, in accordance with one embodiment of the present invention.

FIG. 2B is a cross-sectional view of a portion of the lid shown in FIG. 2A prior to any metallization being deposited.

FIG. 2C is a cross-sectional view of a portion of the lid shown in FIG. 2A after metallization is deposited.

FIG. 2D is a top view of a portion of one of the conductive flashes shown in FIG. 2C.

FIG. 3A is an isometric view of the substrate, in accordance with one embodiment of the present invention.

FIG. 3B is a cross-sectional view of a portion of the substrate shown in FIG. 3A.

FIG. 4A is a cross-sectional view of the metals which make up the conductive flashes shown in FIG. 2C before the reflow process, in accordance with one embodiment of the present invention.

FIG. 4B is a cross-sectional view of the metals which make up the conductive flashes shown in FIG. 2C after reflowing the lid to the substrate shown in FIG. 3A, in accordance with one embodiment of the present invention.

FIG. 5 is a flow diagram depicting the procedural steps for carrying out one embodiment of the present invention.

DETAILED DESCRIPTION OF A PREFERRED EMBODIMENT

Figure 4C:
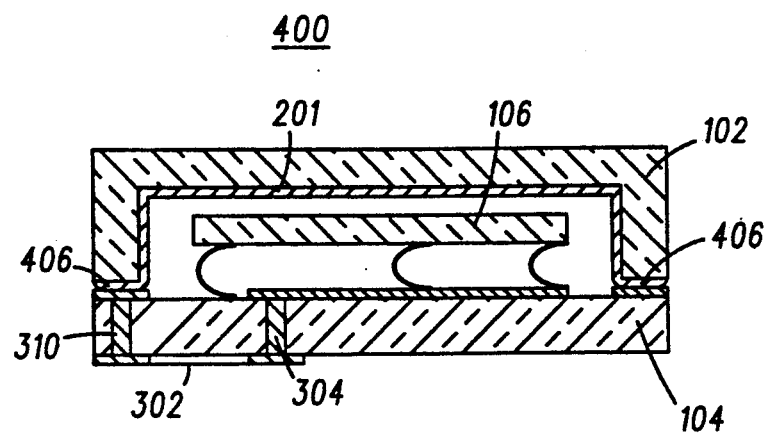
FIG. 4C shows a cross-sectional view of an assembled quartz crystal filter, n accordance with the present invention.

FIG. 1 shows a cross-sectional view of a typical, surface-mountable monolithic quartz crystal filter. Such a device is often used in the receiving and transmitting ends of a communication system, an embodiment which is later described. Referring to FIG. 1, quartz plate 106 is mounted, via mount structures 116, to substrate 104. Metallization layer 112 serves as an electrical ground plane for the crystal filter circuit disposed on the substrate 1 04. Since such a device is highly sensitive to changes in its immediate environment, the lid 102 is generally affixed, as later described, to the substrate 104 in such a way as to provide an airtight seal between the two. Lid 102, which may be constructed of a conductive material or of a non-conductive material, has disposed on it a film 110, which may be a solder based alloy, on its edge. In the preferred embodiment, lid 102 is constructed of a non-conductive ceramic material. Similarly, layer 108 is disposed peripherally about the electrical circuit on the substrate 104. A reflow process is then used to affix the lid 102 to the substrate 104 by bonding the materials Of film 110 and layer 108 to form an airtight, or hermetic, seal. A typical hermeticity requirement for such devices may be given in terms of a "leak rate" on the order of $1 \times 10^{-8}$ std. cc/sec.

FIG. 2A shows how the conductive shielding layer is deposited on the interior surface of lid 102, in the preferred embodiment of the invention. A portion of the lid 102 is shown, which is to have a film 110 deposited on its edge. A wire mesh 202 is then placed in such a way as to rest on top of the film 1 10. A conductive flash, which may comprise several layers of metallization deposited in the same plating process, is then deposited on the interior surface, and edges, of the lid 102, using a plating source 207. The Plating source 207 may be embodied using any number of well known plating configurations (e.g., E-beam evaporator, thermal evaporator, sputtering machine, etc.). sputtering machines, in particular are well suited for carrying out this particular embodiment of the invention, as they readily adapt to a batch Process, such that many lids 102 may be placed on a sputtering platen, in a random arrangement, before a continuous wire mesh 202 is placed over them. It should be noted that the orientation of the grid pattern in the wire mesh 202 with respect to the edges of the lids 102, is unimportant. It is only important that the portion of conductive flash deposited on the film 110 is Partially contiguous, while the portion reaching the interior surface is entirely contiguous.

FIG. 2B shows a cross-sectional view of the plating arrangement shown in FIG. 2A, prior to the deposition of the conductive flashes. It can be seen that wire mesh 202 comes in direct contact with the film 110 such that when plating source 207, removed a distance 206 from the wire mesh 202, emits metallization 204 toward the lid 102, part of the film 110 is left unplated. In contrast, because of the separation 205 between the mesh screen 202 and the interior surface of the lid 102, the interior surface is coated with a conductive flash which is entirely contiguous. FIG. 2C shows the cross-sectional view of a shielded lid 250, in accordance with one embodiment of the present invention. Conductive flash 203 is a partially contiguous conduction layer deposited on the film 110, while conductive flash 201 is a substantially contiguous conduction layer deposited on the interior surface of the lid 102. It should be noted that conductive flash 20 though substantially non-uniform is sufficiently thick, even at its minimum thickness points, to readily conduct electric energy from all points on the interior surface of the the lid 102, to any other point on that surface. FIG. 2D shows a close-up top view of a portion of conductive flash 203, shown in FIG. 2C. The "waffle" pattern of the wire mesh 202 produces the pattern shown in area 231 which appears on film 110 after the deposition process. The voids, shown between sections of conductive flash 203, provide for the controlled wicking characteristics between the film 110 and the material used to affix the lid 102 to the substrate 104 during the reflow process.

FIG. 3A shows a substrate 104 for a monolithic quartz crystal filter, in accordance with the present invention. Disposed on the substrate 104, is a conductive area 112 which serves as the electrical ground plane for the electrical circuit. Layer 108, which may be a solder-based alloy, is disposed on the same side of the substrate 104 and acts as a mating metal during the subsequent reflow process. Plated through-holes, or vias 303, combined with conductive areas 301, serve as pin-outs to bring the input and output ends of the filter to the other side of the substrate for surface mounting. Via 304 acts in concert with via 310 to electrically connect the circuit ground plane 112 with layer 108, and ultimately, the shielded lid 250 which is subsequently affixed. FIG. 3B shows a cross-sectional view of a portion of the substrate 04 shown in FIG. 3A, depicting the electrical connection between vias 304 and 310. Ground plane 112 is electrically connected to via 304, while layer 108 is electrically connected to via 310. Conductive strip 302, disposed on the opposite side of substrate 104 as the ground plane 112, is then used to electrically connect via 304 with via 31 0. This connection allows the circuit ground plane to be held at the same electric potential as the shielded lid without compromising the hermeticity of the assembled package.

FIG. 4A shows a close-up view of the arrangement shown in FIG. 2C, depicting the metallic composition of conductive flashes 201 and 203, as they may appear before the reflow process. In the preferred embodiment, it is assumed that film 110 and layer 108 both consist of a solder-based alloy, while the lid 102 is formed of a ceramic material. Conductive flash 201 comprises a base metal 403 which is non-wettable with solder, a metallization layer 402 which is wettable with solder, and a layer 401 which, like layer 403, is non-wettable with solder. Similarly, conductive flash 203 comprises the same metallic composition, a solder-wettable metal 402 (e.g., silver) sandwiched between two solder-nonwettable metals 401, 403 (e.g., chromium). The like composition of conductive flashes 201 and 203 further makes it possible to deposit them onto the lid 102 during the same deposition process. FIG. 4B shows a close-up view of the metallic composition of the arrangement shown in FIG. 4A, after the reflow process. Lid 102 and substrate 104 are physically joined together by the solder Composition 406 formed when reflowing the solder layer 108 with solder film 110. Note that metallization layers 401 and 403 prevent undesired wicking onto the substrate 104, and the lid 102, respectively.

FIG. 4C shows a cross-sectional view of the assembled Circuit 400, as it may appear in one embodiment of the invention. Non-conductive lid 102 is affixed to substrate 104 using the reflow solder Composition 406. Plated vias 304 and 310, in combination with conductive strip 302, serve to electrically connect the circuit ground plane 112 to conductive flash 201. This connection completes the ground path, providing a sound, effective shield against the ill effects of extraneous RF energy.

FIG. 5 shows the shielding process flow 500 in accordance with the present invention. A conductive solder is deposited at 502 on the edge of the lid 102. A wire mesh is then placed at 504 over one or more lids, whose edges are facing a plating source, such that the mesh is resting on the soldered edge. The first and second conductive flashes are then deposited at 506 through the wire mesh and onto the lid 102. As mentioned earlier, the first and second conductive flashes comprise a three metal system as described in FIGS. 4A and 4B, in the preferred embodiment of the invention. The lid edges are then aligned at 508 with solder layer 108 deposited on the substrate 1 04. The joined lid and substrate are then reflowed at 510 to create a conductive, hermetic seal between the two entities. The process flow then ends at 512, yielding a hermetically sealed shielding enclosure for the circuit disposed inside the non-conductive package.

Figure 6:
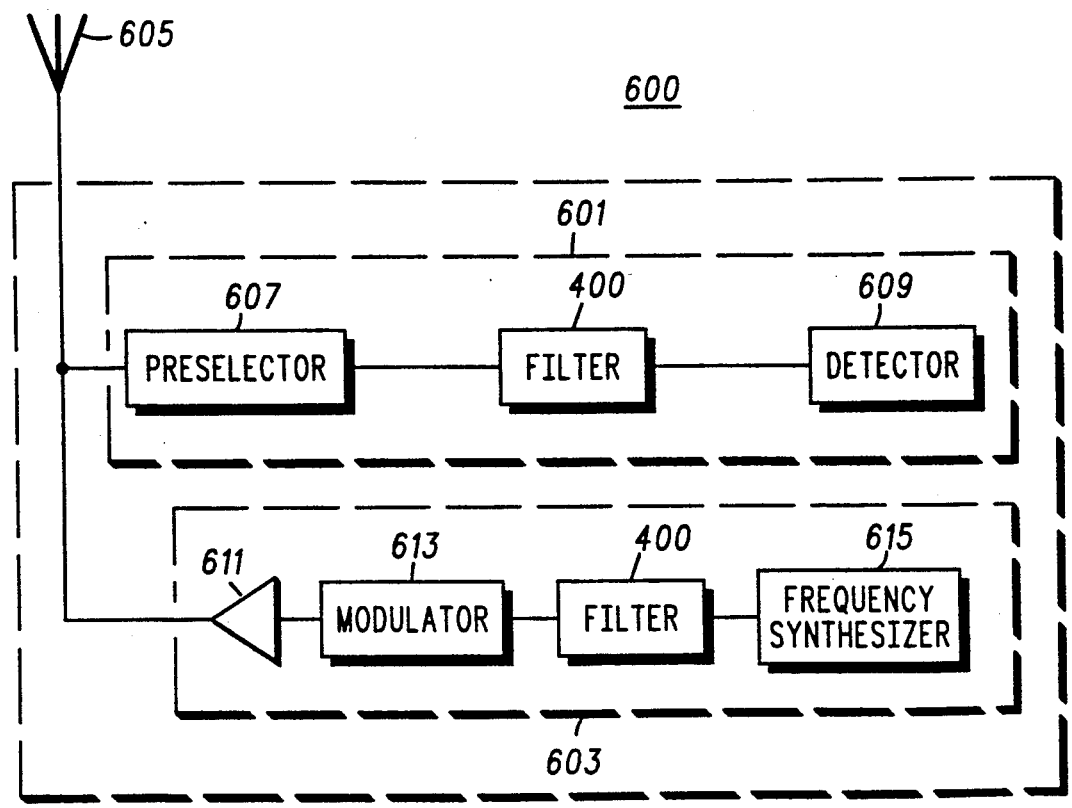
FIG. 6 shows a radio having a circuit which employs the shielding apparatus, in accordance with the present invention.

FIG. 6 shows a radio transceiver 600 which employs the assembled circuit 400, in accordance with the present invention. In this particular embodiment, assembled circuit 400 represents a quartz crystal filter which may be used for filtering electrical signals in the transmitting and/or receiving ends of a radio, for example a Motorola DYNATAC Cellular Radiotelephone (as shown in Motorola Instruction Manual No. 68P81049E72, pg. 5, dated Nov. 5, 1985). In the receiving end 601, an antenna 605 is coupled to a preselector stage 607. The preselected signal is then sent through an intermediate frequency (IF) filter stage before being passed to a detector 609. The filter stage, which may include buffers and filters 411, typically include at least one 45 MHz quartz crystal filter, though it is understood that alternate embodiments may be employed. In the transmitting end 603, filter 400 is coupled between a frequency synthesizer 615 and a modulator 613. In the preferred embodiment, the modulated signal is then passed to a power amplifier 611 before being transmitted via antenna 605. It should be noted that the transmitting and receiving functions of the radio transceiver 600 can be, and often are, split between two or more separate housings. The filter 400 of the present invention is equally well suited for these embodiments. It should further be noted that, though not presented here, any electrical device which is sensitive to extraneous RF energy, may make use of the invention. Examples of such devices may, for example, oscillators which reside in the frequency synthesizer 615, or multi-pole filters residing in the preselector 607.

What is claimed is:

1. A shielding apparatus for an insulating lid having an edge and an interior surface, the edge being retained in contact with a substrate having the electrical circuit disposed thereon, the shielding apparatus comprising:
   a film disposed on the edge of the insulated lid;
   a first conductive flash selectively disposed on the first interior surface, such that a substantially non-uniform, contiguous conduction layer is disposed thereon;
   a second conductive flash selectively disposed on said film, to produce a conduction layer which partially covers said film; and
   means, disposed on the substrate and substantially aligned with said film disposed on the edge of the insulated lid, for hermetically affixing the insulated lid to the substrate, whereby a hermetically sealed enclosure for isolating the electrical circuit from extraneous radio frequency energy is produced.

2. A shielding apparatus in accordance with claim 1, further comprising a conductive area disposed on the substrate and forming an electrical ground plane for the electrical circuit.

3. A shielding apparatus in accordance with claim 2, further comprising means for joining said conductive area to said enclosure.

4. A shielding apparatus in accordance with claim 1, wherein said film further comprises a conductive material.

5. A shielding apparatus in accordance with claim 1, wherein said first and said second conductive flash further comprises at least one metallic composition which is wettable with said film.

6. A shielding apparatus in accordance with claim 1, wherein said first and said second conductive flash further comprises at least one metallic composition which is non-wettable with said film.

7. A shielding apparatus for an electric circuit, which apparatus includes an insulated lid and an insulated substrate, the insulated substrate having the electrical circuit disposed thereon and having a first surface and a second surface, the insulated lid having a first interior surface and an edge, the electrical circuit including a conductive area disposed on the first surface, the shielding apparatus comprising:
   a film disposed on the edge of the insulated lid;
   a first conductive flash selectively disposed on the first interior surface, such that a substantially non-uniform, contiguous conduction layer is produced thereon;
   a first conductive flash selectively disposed on said film, to produce a conduction layer which partially covers said film;
   means, disposed peripherally about the electrical circuit on the first surface and substantially aligned with said film disposed on the edge of the insulated lid, for affixing the insulated lid to the substrate, whereby a hermetically-sealed enclosure for isolating the electrical circuit from extraneous radio frequency energy is produced; and
   means for connecting the conductive area to said hermetically-sealed enclosure, said means for connecting further comprising:
      a first via extending through the substrate within a boundary defined by the conductive area on the substrate, said first via having a first interior surface which is substantially coated with a conductive material, whereby the conductive area is electrically connected to the first via;

a second via extending through the substrate and substantially aligned with said means for affixing, said second via having a second interior surface which is substantially coated with a conductive material, whereby said hermetically sealed enclosure is electrically connected to the second via; and a conductive strip disposed on the second surface extending from the first via to the second via, whereby the first via is electrically connected to the second via.

8. A shielding apparatus in accordance with claim 7, wherein said film further comprises a conductive material.

9. A shielding apparatus in accordance with claim 7, wherein said first and said second conductive flash further comprises at least one metallic composition which is wettable with said film.

10. A shielding apparatus in accordance with claim 7, wherein said first and said second conductive flash further comprises at least one metallic composition which is non-wettable with said film.

11. A method of shielding an electrical circuit using an apparatus which includes an insulated lid having an edge and an interior surface, the edge being retained in contact with a substrate having the electrical circuit disposed thereon, the method comprising the steps of:

depositing a conductive solder on the edge of the insulated lid;

selectively depositing a first conductive flash on the interior surface, such that a substantially non-uniform, contiguous conduction layer is disposed therein;

depositing a second conductive flash on said film to produce a partially contiguous conduction layer; and hermetically affixing the insulated lid to the substrate, whereby a hermetically sealed enclosure for isolating the electrical circuit from extraneous radio frequency (RF) energy is produced.

* * * * *

UNITED STATES PATENT AND TRADEMARK OFFICE
CERTIFICATE OF CORRECTION

PATENT NO. : 5,313,371
DATED : May 17, 1994
INVENTOR(S) : Thomas A. Knecht et al.

It is certified that error appears in the above-identified patent and that said Letters Patent is hereby corrected as shown below:

In Claim 1, Col. 6, line 4, the word "insulating" should be --insulated--.

In Claim 7, Col. 6, line 53, the word "first" should be --second--.

In Claim 11, Col. 8, line 17, after the word "layer" please insert the word --thereon--.

Signed and Sealed this

Sixth Day of September, 1994

Attest:

BRUCE LEHMAN

*Attesting Officer*  *Commissioner of Patents and Trademarks*